United States Patent
Windsheimer

(10) Patent No.: US 6,275,021 B1
(45) Date of Patent: Aug. 14, 2001

(54) ELECTRICITY METER

(75) Inventor: Klaus Windsheimer, Spalt (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/407,265

(22) Filed: Sep. 28, 1999

Related U.S. Application Data

(63) Continuation of application No. PCT/DE98/00772, filed on Mar. 16, 1998.

(30) Foreign Application Priority Data

Mar. 27, 1997 (DE) .................................. 197 13 120

(51) Int. Cl.$^7$ .......................... G01R 21/00; G01R 21/06; G01R 19/22
(52) U.S. Cl. .......................... 324/142; 324/141; 324/120; 702/61
(58) Field of Search .......................... 324/142, 120, 324/76.11, 107, 141; 702/60, 61, 62; 340/870.02; 379/106.03, 106.07

(56) References Cited

U.S. PATENT DOCUMENTS

| | | | |
|---|---|---|---|
| 3,723,872 | * 3/1973 | Rich | 324/141 |
| 4,096,436 | * 6/1978 | Cook et al. | 324/142 |
| 4,752,731 | * 6/1988 | Toda | 324/142 |
| 6,078,870 | * 6/2000 | Windsheimer | 702/61 |

FOREIGN PATENT DOCUMENTS

| | | |
|---|---|---|
| 740487 | 10/1943 | (DE) . |
| 19526723C1 | 2/1997 | (DE) . |
| 0420545A2 | 4/1991 | (EP) . |

* cited by examiner

*Primary Examiner*—Safet Metjahic
*Assistant Examiner*—Anjan K Deb
(74) *Attorney, Agent, or Firm*—Herbert L. Lerner; Laurence A. Greenberg; Werner H. Stemer

(57) ABSTRACT

The invention relates to an electricity meter with signal channels that are passed to a digital signal processing device and each of which has a multiplexer with downstream analog/digital converter. Voltage signals of an electrical consumer can be connected to a first input of the analog/digital converter of the first signal channel, and current signals of the electrical consumer can be connected to a first input of the analog/digital converter of the second signal channel. In order to allow the meter to be used without any circuit variation both as a four-conductor meter and as a three-conductor meter, one of the voltage signals can be connected to a second input of the analog/digital converter of the first signal channel.

13 Claims, 1 Drawing Sheet

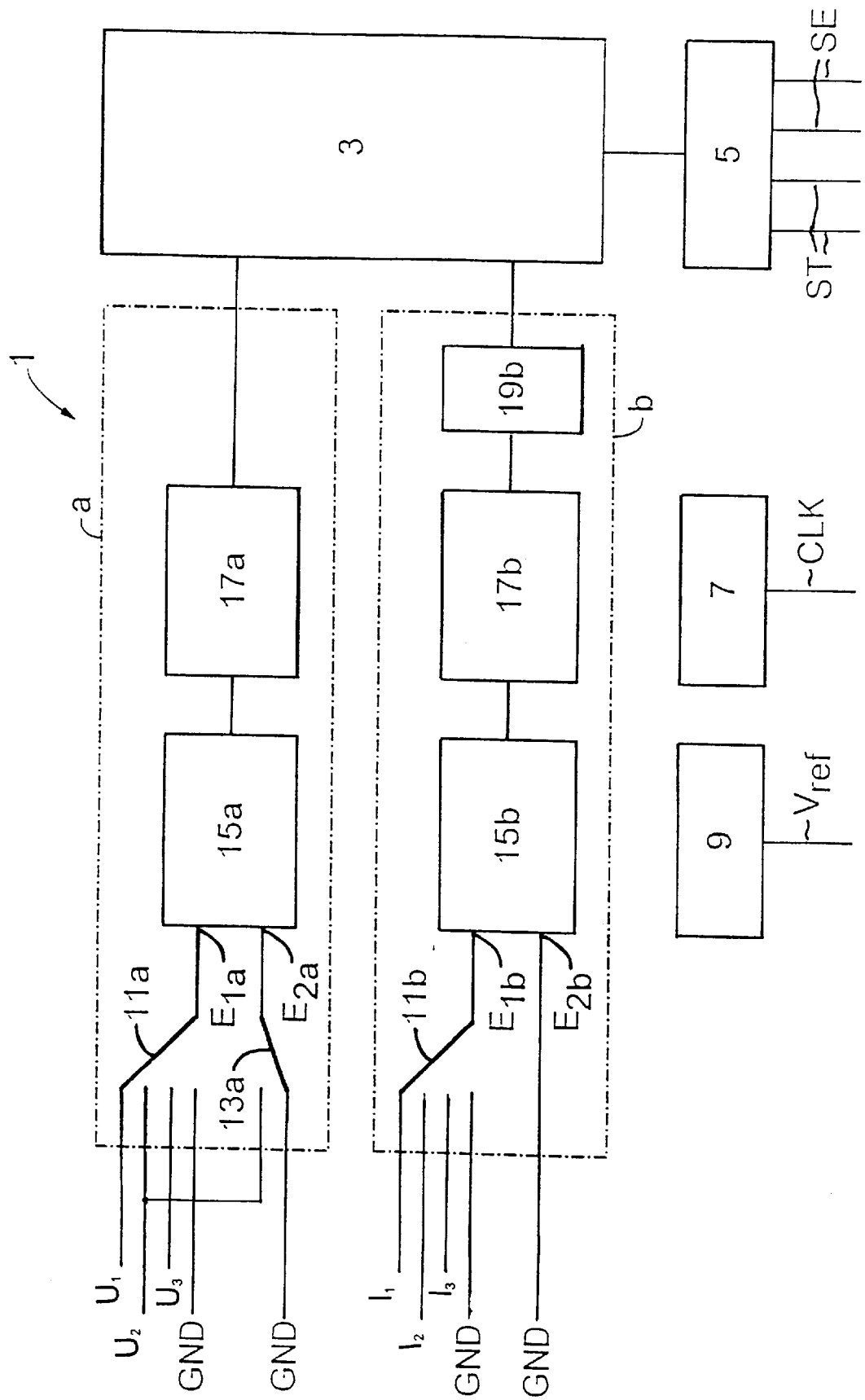

ELECTRICITY METER

CROSS-REFERENCE TO RELATED APPLICATION

This is a continuation of copending International Application PCT/DE98/00772, filed Mar. 16, 1998, which designated the United States.

BACKGROUND OF THE INVENTION

Field of the Invention

The invention lies in the field of electrical engineering. More specifically, the invention relates to an electricity meter having signal channels which are passed to a digital signal processing device and each of which has an analog/digital converter. Voltage signals of an electrical consumer, which are detected by means of transformers, can thereby be connected to a first input of the analog/digital converter of a first signal channel, and current signals of an electrical consumer, which are detected by means of transformers, can be connected to a first input of the analog/digital converter of the second signal channel. In this context, the term current signals also refers to voltage signals that are proportional to the respective currents. Such an electricity meter is described, for example, in my earlier German patent DE 195 26 723 C1. In that electricity meter, which is designed for a high level of self-monitoring of its measurement or signal channels, the signals which are associated with the respective different signal channels are used to form comparison values. This allows a plausibility check to be carried out on the detected measured values or signals. In this way, it is possible, for example, to find out whether an internal or external fault is present, in which case logic operations in the digital signal processing device may allow the fault to be traced in more detail, or localized.

German patent DE 740 487 C discloses a rotary current three-phase meter which, by using an Aron (two-wattmeter) circuit, can be used for three-conductor and four-conductor connection.

SUMMARY OF THE INVENTION

It is accordingly an object of the invention to provide a electricity meter, which overcomes the above-mentioned disadvantages of the heretofore-known devices and methods of this general type and which can be used both as a four-conductor meter and as a three-conductor meter while having a simple circuit design at the same time. It is a further object of the invention to disclose a particularly suitable method of operating the electricity meter.

With the foregoing and other objects in view there is provided, in accordance with the invention, an electricity meter, comprising:

a digital signal processing device;

first and second signal channels each connected to the digital signal processing device;

a first analog/digital converter connected in the first signal channel and having a first input receiving voltage signals of an electrical consumer, which are detected by means of transformers, and a second input forming a difference input with the first input;

a second analog/digital converter connected in the second signal channel and having a first input receiving current signals of the electrical consumer, which are detected by means of transformers; and a changeover switch connected upstream of the second input of the first analog/digital converter for selectively passing one of the voltage signals or a neutral conductor signal to the second input.

The invention is based on the idea that the electricity meter, i.e. the circuit on which the meter is based, can be used not only for operation as a three-conductor meter but also for operation as a four-conductor meter, provided the circuitry for the so-called Aron circuit (two-watt meter circuit) is incorporated. This can in turn be achieved in a simple manner if it is possible to detect directly difference voltages in the signal channel which detects the voltage signals. By suitable configuration, it is then possible to find out whether operation as a four-conductor meter with a neutral conductor connected or operation as a three-conductor meter without a neutral conductor being connected is envisaged. A virtual star point is then formed for three-conductor operation.

When operated as a four-conductor meter with a neutral conductor connected, the voltage signals of all three phases (R, S, T) are detected while, when operated as a three-conductor meter, the difference voltages between the phases R and S as well as T and S are detected directly. For this purpose, the analog/digital converter in the signal channel for the voltage values (voltage channel) has a second input, to which the voltage signal from, expediently, phase S can be connected for operation as a three-conductor meter. For operation as a four-conductor meter, a neutral conductor potential is connected to this input as the input signal.

In accordance with an added feature of the invention, the changeover switch is a multiplexer.

In accordance with an additional feature of the invention, a multiplexer is connected upstream of each first input of the analog/digital converter in each channel, the multiplexer detecting three-phase measured values on an input side thereof.

In other words, multiplexers are preferred as the changeover switches for the individual voltage and current signals. By means of these multiplexers, it is expediently possible to supply a neutral conductor signal not only to both inputs of the analog/digital converter in the voltage channel, but also to the first input of the analog/digital converter in the second signal channel (current channel).

The changeover switch or multiplexer associated with the second input of the analog/digital converter in the voltage channel, is designed to detect one phase and the neutral conductor signal. In contrast, the number of inputs of the multiplexer which is associated with the respective first input of the analog/digital converter in the respective signal channel is designed to detect three-phase measured values. In this case, the multiplexers which are connected upstream of the analog/digital converters are expediently synchronized to one another. It is thus possible to compare simultaneous measured values for signals. This applies in particular to the formation of power values for consumption measurement.

In accordance with a further feature of the invention, when the voltage signal is connected to the second input of the first analog/digital converter, the first input is connected to another one of the voltage signals, and the first analog/digital converter outputs a corresponding difference voltage on its output side.

In accordance with again an added feature of the invention, a decimation filter is connected in each of the first and second signal channels between the analog/digital converter and the digital signal processing device.

The analog/digital converters are expediently sigma-delta modulators, preferably of the second order. In that case it is an advantageous refinement to have the decimation filter connected downstream of each analog/digital converter. The decimation filter converts a bit stream at a high sampling rate emitted by the analog/digital converter into a digital signal which is available for further signal processing and has a comparatively low sampling rate, but high resolution.

In accordance with again an additional feature of the invention, a high-pass filter is connected in the second signal channel. While the voltage channel is high-pass filtered with a variable time constant, expediently within the digital signal processing device, the separate high-pass filter in the second channel filters out direct-current elements. The separate high-pass is connected upstream of the signal processing device, within the current channel.

In accordance with again another feature of the invention, a common signal clock apparatus is connected to the first and second analog/digital converters and to the digital signal processing device. The clock apparatus provides a system clock for both the signal processing device and for the analog/digital converters. The clock apparatus is expediently a divider, which divides an external clock source downward by a specific ratio.

With the above and other objects in view there is also provided, in accordance with the invention, a method of operating the above-described electricity meter. The method comprises the following steps:

selectively operating the electricity meter in a four-conductor meter mode or in a three-conductor meter mode;

in the four-conductor meter mode, connecting a neutral conductor signal to the second input of the first analog/digital converter of the first signal channel, and forming a sum of a product of the voltage signals detected in the first signal channel and the current signals simultaneously detected in the second signal channel; and in the three-conductor meter mode, connecting one of the voltage signals to the second input of the analog/digital converter of the first signal channel, detecting difference voltages in the first signal channel, and forming a sum of products of the difference voltages detected in the first signal channel and current signals simultaneously detected in the second signal channel.

The advantages achieved by the invention are, in particular, that the circuitry implementation allows direct measurement of difference voltages between the phases of a three-phase power supply with a neutral conductor connected, without any additional hardware components and without circuit variation in operation, both as a four-conductor meter and as a three-conductor meter. In other words, both modes can be provided by the same circuit. The difference voltages are detected without any additional computation complexity, in a simple manner, by providing the two-watt meter circuit at the inputs of the analog/digital converter in the voltage channel. The respective current signals for a power measurement can thus be detected at the same time that the voltage signals are detected.

Other features which are considered as characteristic for the invention are set forth in the appended claims.

Although the invention is illustrated and described herein as embodied in an electricity meter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing figure.

BRIEF DESCRIPTION OF THE DRAWING

The FIGURE is a block diagram of the electricity meter according to the invention.

DESCRIPTION OF THE PREFERRED EMBODIMENTS

Referring now to the sole figure of the drawing in detail, there is seen a block diagram of a novel electricity meter. Identical and functionally identical parts are provided with the same reference symbols, with identical details of different groups being distinguished from one another by appended letters—corresponding to the respective signal channel a, b.

The electricity meter (meter) 1 has two signals a and b, which are passed to a common digital signal processing device 3. The measured values are processed in the digital signal processing device 3, for consumption measurement as well as for other functions of the meter 1. The digital signal processing device 3 is preferably in the form of a digital signal processor. Alternatively, it may also be in the form of a computation device having a microcomputer, or in the form of a hard-wired logic circuit. The essential feature in this case is that the signals or data provided by the signal channels a and b can be processed digitally. All the illustrated components of the meter 1 are preferably combined on a common circuit board.

The digital signal processing device 3 has an associated interface 5, via which control signals ST are supplied from the outside and result signals SE, for example a real power and/or volt-amperes, can be output. The illustration also shows a system clock apparatus 7, to which a clock signal CLK can be supplied. A device 9 for processing a reference voltage $V_{ref}$, which can be supplied from the outside, is also shown. All the components of the meter 1 shown in the figure can be provided in an IC or an ASIC.

The first signal channel a is in the form of a voltage channel. The second signal channel b is in the form of a current channel. The following text is based on the assumption that three-phase signals are being processed, including a neutral conductor signal, from a corresponding consumer or network. The first signal channel a is thus supplied with the voltage signals $U_1$ to $U_3$ and a neutral conductor signal GND. The second signal channel b receives the current signals $I_1$ to 13 for the respective phase and, likewise, the neutral conductor signal GND.

The signals mentioned above are respectively passed to the inputs (which are not designated in any more detail) of the multiplexers 11a, 11b in the respective signal channel a or b. The first signal channel a also contains a further multiplexer 13a as a changeover switch, to whose inputs the voltage signal $U_2$ and the neutral conductor signal GND are passed. The parallel connection of signals to a plurality of multiplexers 11a, 11b, 13a, in particular the connection of the voltage signal $U_2$ and of the additional neutral conductor signal GND, can be provided by internal wiring in the meter 1, for example by appropriate wiring on a printed circuit board. External wiring is also possible.

In the first signal channel a, an analog/digital converter in the form of a sigma-delta modulator 15a is connected downstream of the multiplexers 11a and 13a. In this case, the multiplexer 11a is connected on its output side to a first, positive input $E_{1a}$ of the modulator 15a, while the other multiplexer 13a is connected on the output side to a second, negative input $E_{2a}$ of the modulator 15a. These two inputs $E_{1a}$ and $E_{2a}$ a together form a difference input. A decimation filter 17a is connected between the modulator 15a and the digital signal processing device 3, and preprocesses the digital output signal of the modulator 15a for the signal processing device 3.

In an analogous manner, in the second signal channel b, the multiplexer 11b is connected on its output side to an analog/digital converter in the form of a sigma-delta modulator 15b. For this purpose, the multiplexer 11b is connected to the first, positive input $E_{1b}$ of the modulator 15b. The neutral conductor signal GND is supplied directly to the second, negative input $E_{2b}$.

On the output side, the modulator 15b is once again connected to a decimation filter 17b. However, in contrast to the first signal channel a, this is connected via a separate high-pass filter 19b to the digital signal processing device 3. The high-pass filter 19b is used to filter out direct-current elements from the output signal supplied by the decimation filter 17b. The function of such a high-pass filter in the first signal channel a is provided in the digital signal processing device 3, with the time constant for the high-pass filtering being changed in a variable manner.

The multiplexers 11a, 11b and 13a are synchronized to a common system clock. To this end, the system clock apparatus 7 (which is, for example, a divider in the form of a counter) supplies a clock signal which is derived from the clock signal CLK and is supplied, in a manner which will not be described in any more detail, both to the multiplexers 11a, 11b and 13a and to the digital signal processing device 3. Appropriate connection is preferably once again made by means of appropriate wiring on a printed circuit board on which the illustrated components are fitted. The reference voltage $V_{ref}$ is also supplied as a "bandgap" at, for example, 1.23 volts to the analog/digital converters or modulators 15a and 15b. Once again, the wiring (which is not illustrated for reasons of clarity in the drawing) is preferably on the printed circuit board.

When operated as a four-conductor meter, the other multiplexer 13a in the first signal channel a is switched to the neutral conductor signal GND, which is related to the neutral conductor potential. The neutral conductor signal GND is thus supplied to the second input $E_{2a}$ of the modulator 15a. By switching the multiplexers 11a and 11b in the signal channels a and b, respectively, over at the same time, the voltage and current signals $U_1$, $I_1$ or $U_2$, $I_2$ or $U_3$, $I_3$ are detected and digitized at the same time. The digital signals are processed further in the signal processing device 3. In this way, the consumer power is determined, for example from the sum of the products of the voltage and current signals, using the equation:

$$P=U_1I_1+U_2I_2+U_3I_3$$

and this can be tapped off from the meter 1 as the result signal SE, via the interface 5. In this case, bitstreams supplied by the modulator 15a, 15b and at a sampling rate of 1 to 2 MHz are converted in the decimation filter 17a or 17b, respectively, into bit-parallel signals (with a length of 18 to 20 bits) with a comparatively low sampling rate of 1 to 2 kHz, but with high resolution.

When operated as a three-conductor meter, the multiplexer 13a in the first signal channel a is connected—under the control of the digital signal processing device 3—to the voltage signal $U_2$. In this case, the neutral conductor is not coupled to the neutral conductor signal GND, but forms a synthetic star point via the signal connections which correspond to the voltage signals $U_1$ to $U_3$. Thus, when the multiplexer 11a is switched over alternately between the voltage signals $U_1$ and $U_3$, the respective difference voltage $U_{12}$ or $U_{32}$ is detected directly in the modulator 15a. The corresponding digital value at the output of the modulator 15a thus corresponds to the voltage value $U_{12}=U_1-U_2$ or $U_{32}=U_3-U_2$, respectively. By simultaneously measuring the current signals $I_1$ and $I_3$ in the second signal channel b, it is once again possible for the digital signal processing device 3 to determine the power consumption, using the equation:

$$P=U_{12}I_1+U_{32}I_3$$

The two-wattmeter circuit (Aron circuit) is thus provided without any different hardware variants. Adjustment factors which are used in the measurement carried out during four-conductor operation may also be used during three-conductor operation. For the analog/digital converter or modulator 15a, this does not result in any significant additional complexity, since the sigma-delta converter is provided with a difference input in any case.

I claim:

1. An electricity meter, comprising:
a digital signal processing device;
first and second signal channels each connected to said digital signal processing device;
a first analog/digital converter connected in said first signal channel and having a first input receiving voltage signals of an electrical consumer, and a second input, said first input and said second input together forming a difference input of said first analog/digital converter;
a second analog/digital converter connected in said second signal channel and having a first input receiving current signals of the electrical consumer; and
a changeover switch connected upstream of said second input of said first analog/digital converter for selectively passing one of the voltage signals or a neutral conductor signal to said second input.

2. The electricity meter according to claim 1, wherein said changeover switch is a multiplexer.

3. The electricity meter according to claim 1, which comprises a multiplexer connected upstream of each said first input of a respective said analog/digital converter, said multiplexer detecting three-phase measured values on an input side thereof.

4. The electricity meter according to claim 3, wherein said changeover switch is a multiplexer.

5. The electricity meter according to claim 4, wherein said multiplexers are synchronized to one another.

6. The electricity meter according to claim 1, wherein, when the voltage signal is connected to said second input of said first analog/digital converter, said first input thereof is connected to another one of the voltage signals, and said first analog/digital converter outputs a corresponding difference voltage on an output side thereof.

7. The electricity meter according to claim 1, which further comprises a decimation filter connected in each of said first and second signal channels between said analog/digital converter and said digital signal processing device.

8. The electricity meter according to claim 7, which further comprises a high-pass filter connected in said second signal channel between said decimation filter and said digital signal processing device.

9. The electricity meter according to claim 1, which further comprises a high-pass filter connected in said second signal channel between said second analog/digital converter and said signal processing device.

10. The electricity meter according to claim 1, which further comprises a common signal clock apparatus connected to said first and second analog/digital converters and to said digital signal processing device.

11. The electricity meter according to claim 1, wherein each of said first and second analog/digital converters is a sigma-delta modulator.

12. The electricity meter according to claim 11, wherein said sigma-delta modulator is a second order modulator.

13. A method of operating the electricity meter according to claim 1, which comprises the following steps:

selectively operating the electricity meter in a four-conductor meter mode and in a three-conductor meter mode;

in the four-conductor meter mode, connecting a neutral conductor signal to the second input of the first analog/digital converter of the first signal channel, and forming a sum of a product of the voltage signals detected in the first signal channel and the current signals simultaneously detected in the second signal channel; and in the three-conductor meter mode, connecting one of the voltage signals to the second input of the analog/digital converter of the first signal channel, detecting difference voltages in the first signal channel, and forming a sum of products of the difference voltages detected in the first signal channel and current signals simultaneously detected in the second signal channel.

* * * * *